United States Patent
Lee

(10) Patent No.: US 10,598,735 B2
(45) Date of Patent: Mar. 24, 2020

(54) METHOD AND APPARATUS FOR ESTIMATING BATTERY LIFE CORRESPONDING TO CHARACTERISTIC OF USAGE BASED ON PATTERN INFORMATION

(71) Applicant: Samsung Electronics Co., Ltd., Suwon-si (KR)

(72) Inventor: Sun-Jae Lee, Hwaseong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 641 days.

(21) Appl. No.: 14/682,470

(22) Filed: Apr. 9, 2015

(65) Prior Publication Data
US 2016/0041231 A1 Feb. 11, 2016

(30) Foreign Application Priority Data

Aug. 6, 2014 (KR) .................. 10-2014-0100821

(51) Int. Cl.
| | | |
|---|---|---|
| *G06F 3/01* | (2006.01) | |
| *G01R 31/392* | (2019.01) | |
| *G01R 31/382* | (2019.01) | |
| *G01R 31/367* | (2019.01) | |

(52) U.S. Cl.
CPC ......... *G01R 31/392* (2019.01); *G01R 31/367* (2019.01); *G01R 31/382* (2019.01)

(58) Field of Classification Search
CPC ... G01R 31/392; G01R 31/367; G01R 31/382

USPC .......................................................... 702/63
See application file for complete search history.

(56) References Cited

U.S. PATENT DOCUMENTS

| | | | |
|---|---|---|---|
| 2011/0196633 A1* | 8/2011 | Abe ................... | G01R 31/3624 702/63 |
| 2013/0151227 A1 | 6/2013 | Yang et al. | |
| 2013/0317690 A1 | 11/2013 | Fujita et al. | |
| 2014/0225620 A1* | 8/2014 | Campbell ........... | B60L 11/1838 324/426 |

FOREIGN PATENT DOCUMENTS

| | | |
|---|---|---|
| JP | 2013-77054 A | 4/2013 |
| JP | 2014-20804 A | 2/2014 |
| KR | 10-2012-0102460 A | 9/2012 |
| KR | 10-2013-0036712 A | 4/2013 |
| KR | 10-2013-0120227 A | 11/2013 |

\* cited by examiner

*Primary Examiner* — Anthan Tran
(74) *Attorney, Agent, or Firm* — NSIP Law

(57) ABSTRACT

A method and apparatus for estimating a battery life are provided. The apparatus includes a battery information collector, a model determiner, and a battery life estimator. The battery information collector is configured to collect battery information from a battery. The model determiner is configured to select a battery degradation model representing pattern information corresponding to the battery information. The battery life estimator is configured to estimate battery life information based on the selected battery degradation model.

18 Claims, 22 Drawing Sheets

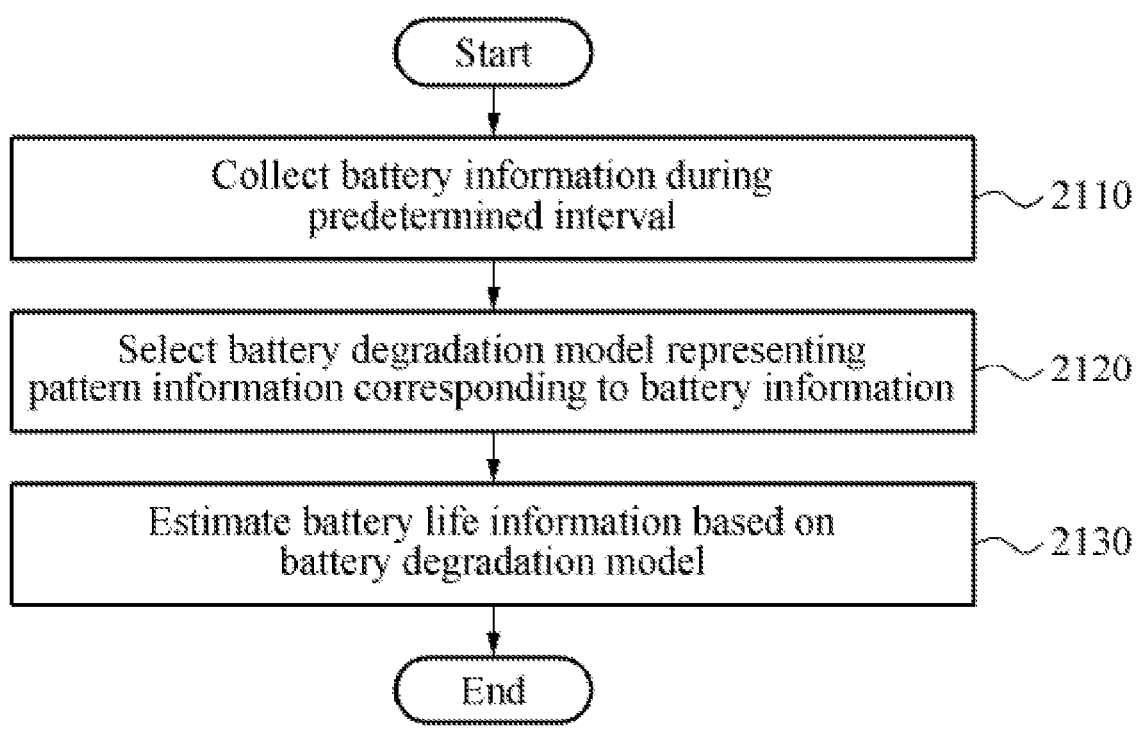

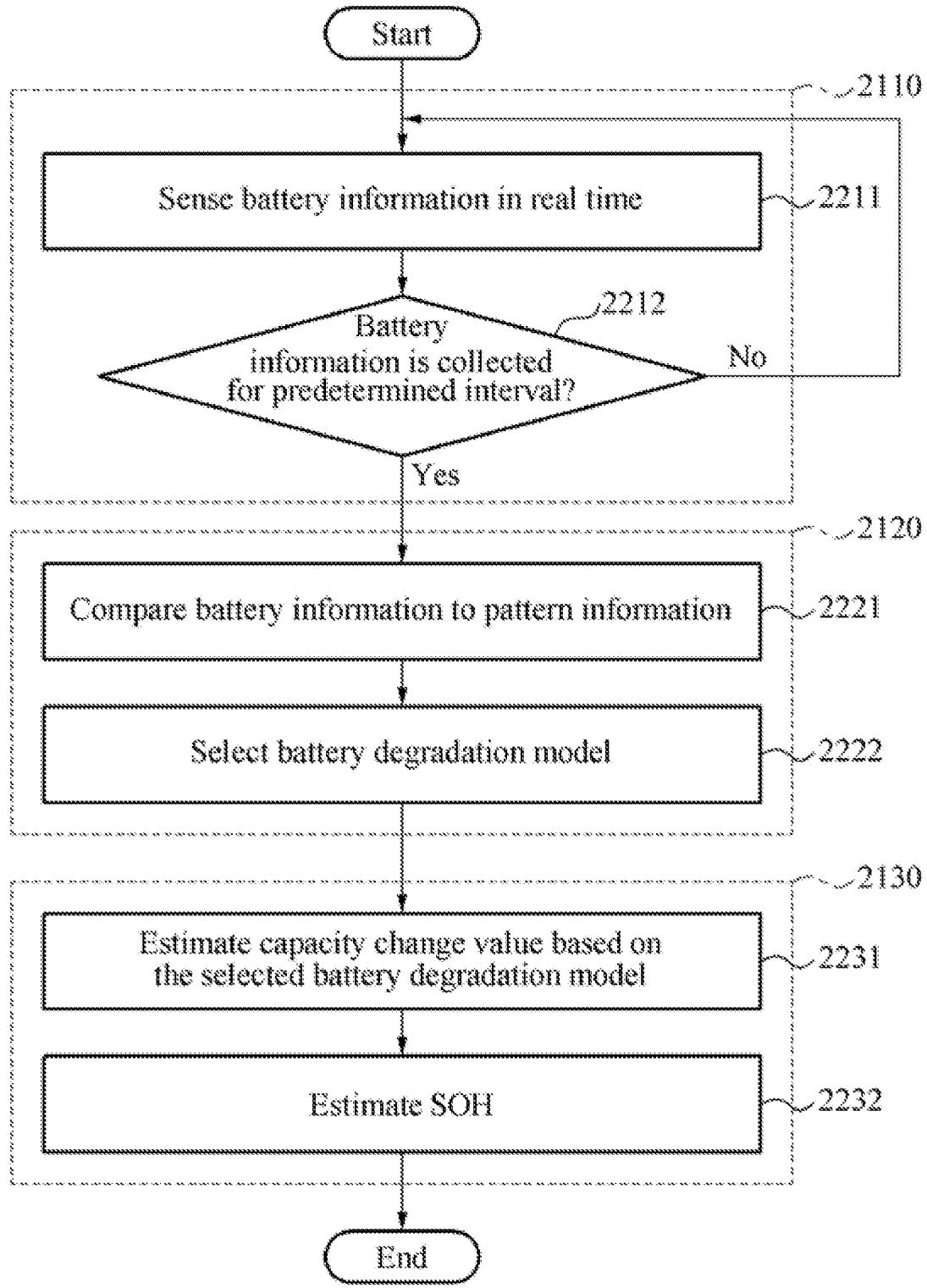

METHOD AND APPARATUS FOR ESTIMATING BATTERY LIFE CORRESPONDING TO CHARACTERISTIC OF USAGE BASED ON PATTERN INFORMATION

CROSS-REFERENCE TO RELATED APPLICATION(S)

This application claims the benefit under 35 USC 119(a) of Korean Patent Application No. 10-2014-0100821, filed on Aug. 6, 2014, in the Korean Intellectual Property Office, the entire disclosure of which is incorporated herein by reference for all purposes.

BACKGROUND

1. Field

The following description relates to a method and apparatus for estimating a life of a battery.

2. Description of Related Art

As a battery in an apparatus is frequently used and used for extended periods of time, a battery life may be reduced. Due to a reduction in the battery life, an initial battery capacity is not guaranteed, and may gradually reduced. Also, a reduction in a capacity of a battery, power, an operating time, and stability that are desired by a user may not be provided. Accordingly, replacement of the battery may be required.

Replacing a battery in a small-sized apparatus, for example a mobile phone, may be easily done. However, replacing a battery in an electric vehicle (EV) may not be easily done as it would require expense and labor time to make such replacement. Accordingly, a method and an apparatus are needed that would be able to determine a life state of the battery and to determine a time to replace a battery would be advantageous to allow a user to plan ahead for the replacement. Also, the ability to determine the life state of the battery and the time before the battery should be replaced are needed to prevent damage to the EV and misuse of the EV.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an illustrative example, there is provided a method to estimate a battery life including collecting battery information from a battery; selecting a battery degradation model representing pattern information corresponding to the battery information; and estimating battery life information based on the selected battery degradation model.

The battery degradation model may be obtained by modeling a degradation in the battery due to a characteristic of usage based on pre-stored reference information.

The characteristic of usage may include at least one of a city driving characteristic, a highway driving characteristic, a suburban driving characteristic, a low acceleration characteristic, a web browsing characteristic, a game characteristic, a moving image characteristic, and a phone call characteristic.

The pattern information may be obtained by partitioning the reference information for each predetermined interval.

The selecting may include comparing the collected battery information to pattern information of the battery degradation model; and selecting the battery degradation model representing pattern information that is most similar to the collected battery information based on a result of the comparing.

The selecting may include computing a similarity between the collected battery information and the battery degradation model; and selecting the battery degradation model corresponding to a similarity exceeding a threshold.

The computing may include computing the similarity based on at least one of a distance comparison, a histogram comparison, and a distribution comparison between the collected battery information and pattern information corresponding to the battery degradation model.

The selecting may include selecting battery degradation models representing pattern information corresponding to the battery information; and applying a weight to each of the selected battery degradation models based on a similarity with the collected battery information.

The estimating may include estimating the battery life information based on a composite model generated by combining the battery degradation models to which the weight is applied.

In accordance with an illustrative example, there is provided a non-transitory computer readable recording medium storing a program to cause a computer to implement the method described above.

In accordance with another illustrative example, there is provided an apparatus to estimate a battery life, including a battery information collector configured to collect battery information from a battery; a model determiner configured to select a battery degradation model representing pattern information corresponding to the battery information; and a battery life estimator configured to estimate battery life information based on the selected battery degradation model.

The battery degradation model may be obtained by modeling a degradation in the battery due to a characteristic of usage based on pre-stored reference information.

The characteristic of usage may include at least one of a city driving characteristic, a highway driving characteristic, a suburban driving characteristic, a low acceleration characteristic, a web browsing characteristic, a game characteristic, a moving image characteristic, and a phone call characteristic.

The pattern information may be obtained by partitioning the reference information for each predetermined interval.

The model determiner may be configured to compare the collected battery information to pattern information of the battery degradation model, and to select the battery degradation model representing pattern information that is most similar to the collected battery information.

The model determiner may be configured to compute a similarity between the collected battery information and the battery degradation model and to select the battery degradation model with a similarity exceeding a threshold.

The model determiner may be configured to compute the similarity based on at least one of a distance comparison, a histogram comparison, and a distribution comparison between the collected battery information and pattern information corresponding to the battery degradation model.

The model determiner may be configured to select battery degradation models representing pattern information corresponding to the battery information, and to apply a weight to each of the selected battery degradation models, based on a similarity with the collected battery information.

The battery life estimator may be configured to estimate the battery life information, based on a composite model generated by combining the battery degradation models to which the weight is applied.

The battery life information may include at least one of a battery life and a variation in the battery life.

Other features and aspects will be apparent from the following detailed description, the drawings, and the claims.

BRIEF DESCRIPTION OF THE DRAWINGS

These and/or other aspects will become apparent and more readily appreciated from the following description of the embodiments, taken in conjunction with the accompanying drawings in which:

FIG. 21 is a flowchart illustrating an example of a method to estimate a battery life.

FIG. 22 is a flowchart illustrating a detailed example of the method of FIG. 21.

Figure 1:
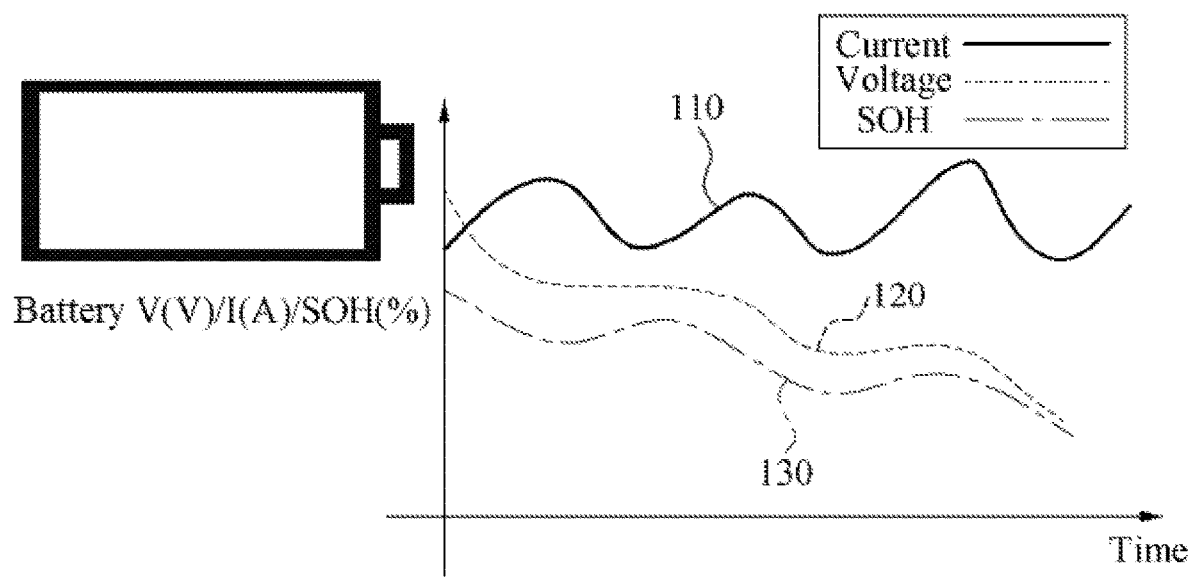
FIGS. 1 through 3 illustrate examples of pattern information.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

In accordance with an embodiment, a secondary battery, for example a lithium ion secondary battery, is rechargeable. When heat of a lithium ion secondary battery is carelessly managed, a risk of severe damage or explosion may exist. To maximally reduce the risk of explosion of the lithium ion secondary battery, a battery is managed using a battery management system (BMS). In the following description, a battery may be a lithium ion secondary battery, but is not limited thereto, and accordingly the battery may be any battery capable of being charged and discharged.

The BMS reduces a risk of explosion of a battery, and increases a life of the battery. For example, the BMS notifies a user of a time to replace a battery. When a battery is used for a predetermined period of time, performance of the battery reduces due to a degradation in the battery, for example, aging of the battery. Accordingly, the user may need to replace the battery.

In an example in which a capacity of a battery at a time of manufacturing of the battery is assumed to be 100%, when the capacity is reduced to 80% as a result of operating use of the battery, the battery may need to be replaced. At a stage where the capacity is equal to or less than 80%, an output of the battery is reduced, and a power loss increases during charging and discharging. As a result, it may be difficult to effectively use the battery at such stage.

In one configuration, the time to replace the battery is represented as a battery life. The battery life is quantified by a state of health (SOH). Typically, the SOH may be estimated based on a capacity of a battery. The SOH may be represented by the following relationship: (current capacity of the battery)/(initial capacity of the battery)×100%.

An accurate measurement of the SOH is important to timely notify a user of a time to replace a battery in the BMS. Ideally, the SOH is estimated based on a reduction in a capacity of a battery. The reduction in the capacity of the battery is accurately measured when a standard charge/discharge condition, for example a condition of fully charging and fully discharging battery, is satisfied.

However, an actually operating electric vehicle (EV) has a small possibility that the standard charge/discharge condition is satisfied, because a driver of the EV typically charges a battery before the battery is fully discharged while driving the EV, for example, before an ignition of the EV is turned off on a road. Additionally, fully discharging of the battery may have a direct influence on a life of the battery, and may reduce the life of the battery. As a result, full discharging of the battery practically may need to be avoided and; accordingly, it may be difficult to satisfy the standard charge/discharge condition.

To estimate a life of a battery, pattern information of data sensed from the battery is collected, analyzed, and learned. The sensed data may include, for example, a current, a voltage, a temperature, and other parameters of the battery known to one of ordinary skill in the art. Based on learning of the pattern information, the life of the battery, for example an SOH, is estimated. For example, when battery information collected from the battery is determined to correspond to predetermined pattern information, the life of the battery is estimated by applying the battery information to a battery degradation model corresponding to the predetermined pattern information.

The above scheme of analyzing and learning the pattern information estimates a change in a capacity of the battery based on the sensed data, regardless of a physical characteristic and a chemical characteristic of the battery, and estimates the SOH.

In the present description, pattern information refers to battery information on a battery degraded due to an arbitrary characteristic of usage during a predetermined interval. The pattern information includes, for example, a current, a voltage, a temperature, an SOH, and other parameters defining an amount of degradation of the battery known to one of ordinary skill in the art. For example, a pattern includes a trend or a form of the battery information.

Additionally, in the present description, battery information refers to all information collectable from a battery, and may include, for example, a sensed current, a sensed voltage, a sensed temperature, and other related sensed parameters.

In addition, in the present description, the characteristic of usage refers to a characteristic shown in battery information while a user arbitrarily uses an apparatus equipped with a battery. In an example, when a battery is mounted in an EV, a characteristic of usage includes a city driving characteristic, a highway driving characteristic, a suburban driving characteristic, a low acceleration characteristic, and other related characteristics of usage. In another example, when a battery is mounted in a smart device (for example, a smartphone, or tablet personal computer (PC)), a characteristic of usage includes a web browsing characteristic, a game characteristic, a moving image characteristic, a phone call characteristic, and other related characteristics.

The city driving characteristic refers to a characteristic shown in battery information when a user drives an EV in the city. The highway driving characteristic refers to a characteristic shown in battery information when a user drives an EV in a highway. The suburban driving characteristic refers to a characteristic shown in battery information when a user drives an EV in a suburb. The low acceleration characteristic refers to a characteristic shown in battery information when a user drives the EV and slowly accelerates.

With regards to a battery in a small electronic device, such as a smart device, a web browsing characteristic refers to a characteristic shown in battery information when a user operates a web browser in the smart device. The game characteristic refers to a characteristic shown in battery information when a user executes a game application in a smart device. The moving image characteristic refers to a characteristic shown in battery information when a user views a moving image using a smart device. The phone call characteristic refers to a characteristic shown in battery information when a user uses a smart device for a phone call.

Figure 2:
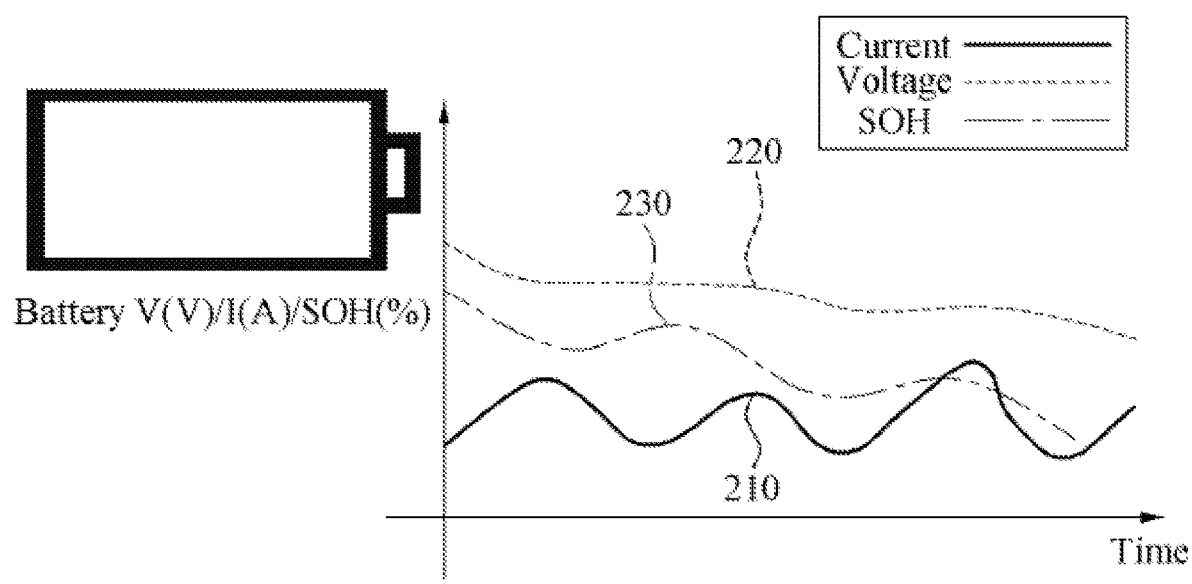
Figure 3:
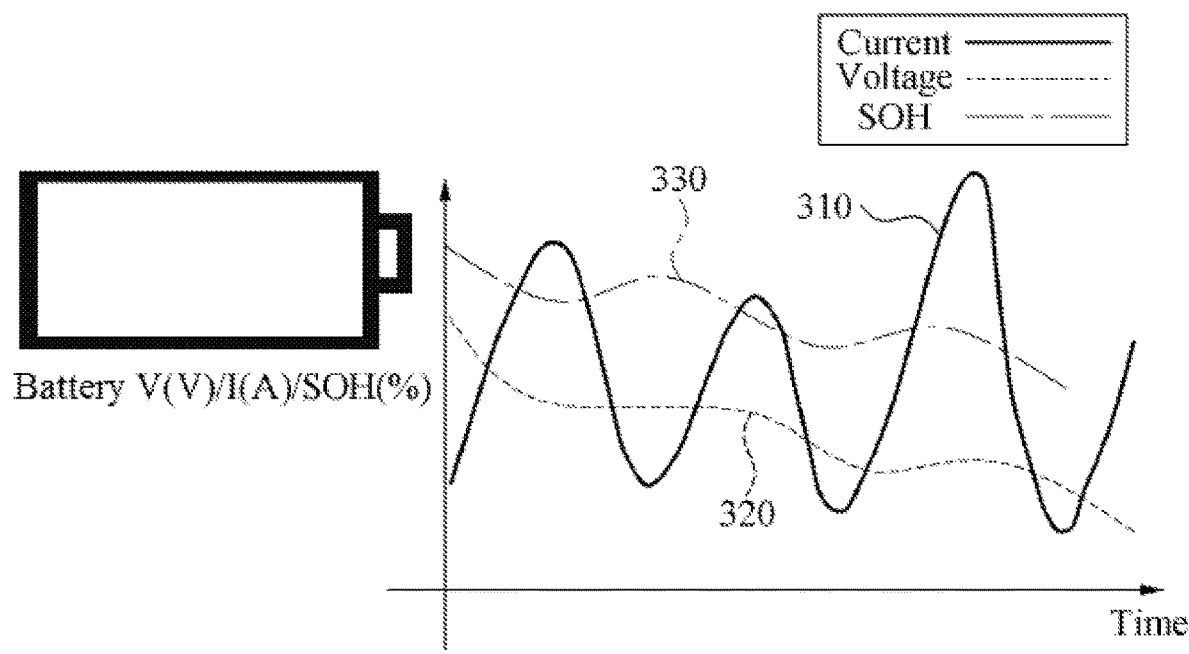

FIGS. 1 through 3 illustrate examples of pattern information.

Referring to FIGS. 1 through 3, the pattern information represents currents, voltages, and SOHs, and includes currents 110, 210 and 310, voltages 120, 220 and 320, and SOHs 130, 230 and 330 that degrade due to different characteristics. For example, the pattern information of FIGS. 1 through 3 are used to reflect currents, voltages, and SOHs on learning of a battery degradation.

However, the same number of various types of pattern information as a number of individuals using batteries (for example, a number of individuals possessing EVs equipped with batteries) may exist. Additionally, pattern information may be too long to learn all pattern information. For example, when a battery life is assumed to be about 10 years, information corresponding to 315,360,000 seconds obtained by "365 days×10 years×24 hours×3,600 seconds" may be required for each pattern information.

When a great variety of pattern information is applied to learning, an accuracy of estimating a battery life may be reduced, which will be further described with reference to FIGS. 4 and 5.

Figure 4:
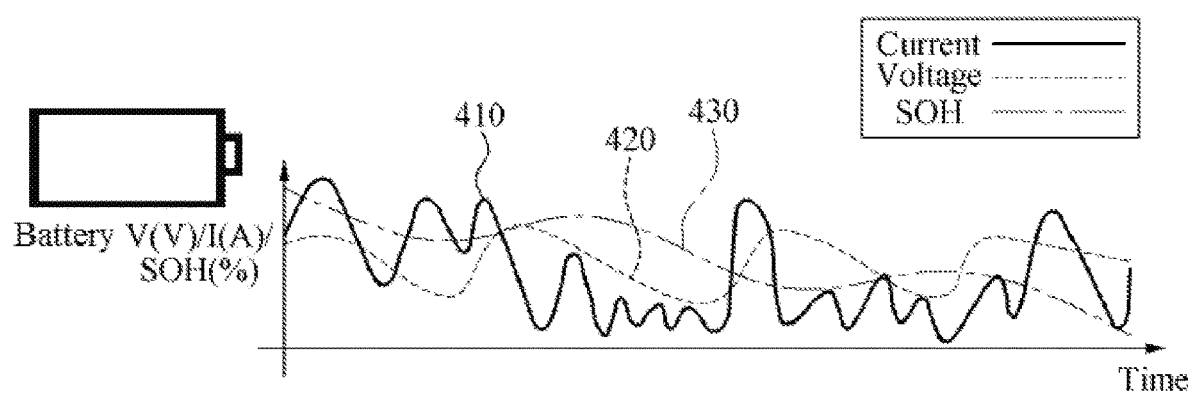
FIG. 4 illustrates an example of test pattern information.

FIG. 4 illustrates an example of test pattern information. FIG. 5 illustrates an example of an SOH estimated based on the test pattern information of FIG. 4.

A battery life estimated from a battery degradation model, which is learned based on test pattern information is sensitive to a change in a pattern. Accordingly, when a battery degradation model is learned based on predetermined pattern information, and when data representing pattern information different from the predetermined pattern information is input, the battery life is incorrectly estimated. For example, a battery life estimated from a battery degradation model, which is learned based on pattern information corresponding to a characteristic in which a temperature, a voltage, or a current of a battery is frequently changed, is different from a battery life estimated from a battery degradation model, which is learned based on pattern information corresponding to a characteristic in which a temperature, a voltage, or a current of a battery remains unchanged. The battery life may be, for example, an SOH.

To enhance an accuracy of estimating a battery life, a battery degradation model is learned based on various types of pattern information. However, because a large number of types of pattern information corresponding to a number of individuals and apparatuses that use batteries exist as described above, it may be impossible to collect all types of pattern information to learn a battery degradation model. In addition, when a number of learned pattern information increases, the accuracy to estimate the battery life may decrease due to overfitting.

Figure 5:
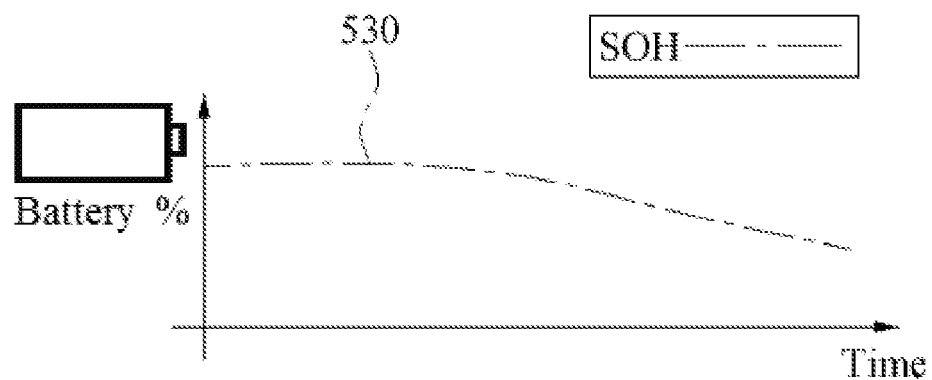
FIG. 5 illustrates an example of a state of health (SOH) estimated based on the test pattern information of FIG. 4.

For example, an SOH 530 of FIG. 5 corresponding to a current 410 and a voltage 420 of FIG. 4 is estimated from a battery degradation model in which various types of pattern information are learned. An actual SOH 430 of FIG. 4 may be quite different from the estimated SOH 530. Accordingly, when various types of pattern information are mixed and learned, a result of estimation of a battery life converges on an average value of the pattern information and accordingly, the accuracy is reduced.

Figure 6:
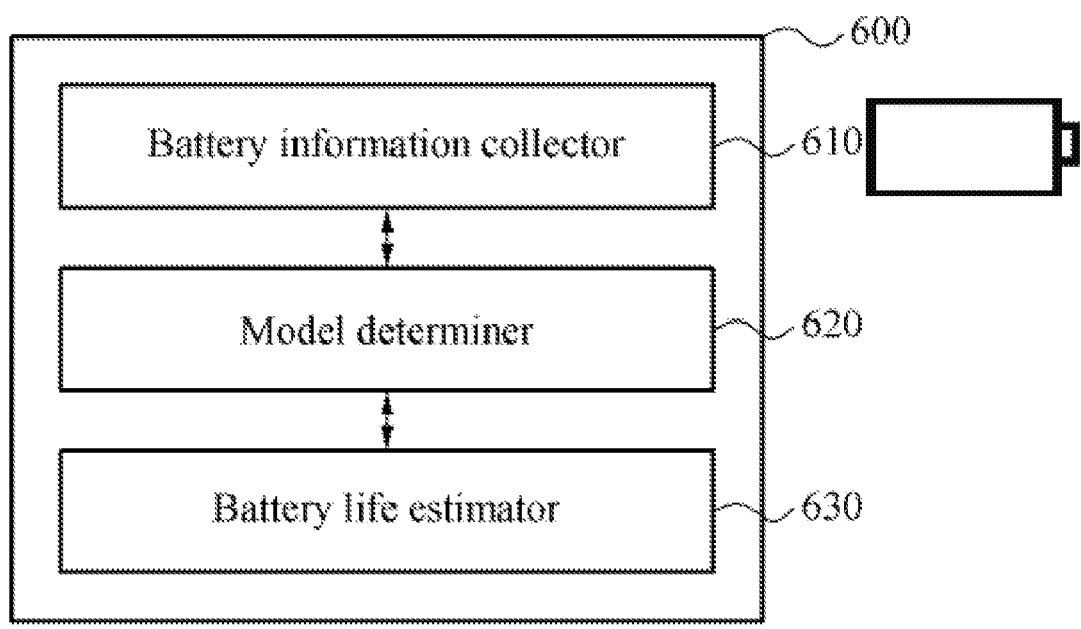
FIG. 6 is a block diagram illustrating an example of a configuration of an apparatus for estimating a battery life.

FIG. 6 illustrates an example of a configuration of an apparatus 600 to estimate a battery life. In the present description, an apparatus to estimate a battery life is referred to as a "battery life estimation apparatus."

Referring to FIG. 6, the battery life estimation apparatus 600 includes a battery information collector 610, a model determiner 620, and a battery life estimator 630.

The battery information collector 610 collects battery information from a battery during a predetermined interval. The predetermined interval is a length of time during which a pattern is represented by collected battery information, and is determined to be identical to an interval of pattern information.

The model determiner 620 selects a battery degradation model representing pattern information corresponding to the battery information from among at least one battery degradation model. Each of the at least one battery degradation model is obtained by modeling a degradation in the battery due to the characteristic of usage based on reference information stored in advance.

Additionally, the model determiner 620 selects battery degradation models representing pattern information corresponding to the battery information, and applies a weight to each of the selected battery degradation models based on a similarity with the collected battery information.

The reference information is used to learn a battery degradation model, and includes, for example, simulated battery information, or battery information collected in advance from a history of an arbitrary user using the battery. The pattern information is obtained by partitioning the reference information for each predetermined interval.

In an example, a battery degradation model is generated that is suitable for pattern information of reference information representing an arbitrary characteristic of usage. An example of learning a battery degradation model based on reference information will be further described with reference to FIG. 8.

The battery life estimator 630 estimates battery life information based on the selected battery degradation model. The battery life information includes, for example, a battery life and a variation of the battery life.

For example, when battery degradation models are selected, the battery life estimator 630 estimates battery life information based on a composite model. The composite model is generated by applying a weight to each of the battery degradation models and by combining the battery degradation models to which the weight is applied. A parameter of the composite model is, for example, a weighted sum of parameters of the selected degradation models, or a weighted sum of a result of the composite model and a battery life estimation result of each of the battery degradation models.

The battery life estimation apparatus 600 collects battery information in real time, determines whether the collected battery information is identical to various types of pattern information, and estimates battery life information based on a battery degradation model corresponding to pattern information identical to the collected battery information.

For example, when a battery is mounted in an EV, battery degradation models corresponding to characteristics of usage, for example a high-speed mode, a medium-speed mode, or a low-speed mode, are generated. The battery life estimation apparatus 600 compares battery information collected in real time during a predetermined interval to pattern information of each of the battery degradation models, and selects a battery degradation model representing pattern information that is most similar to the collected battery information. The battery life estimation apparatus 600 estimates an SOH of the battery by estimating at least one of a capacity of the battery and a change in the capacity from the selected battery degradation model.

In an example, the battery life estimation apparatus 600 estimates a battery life by applying a battery degradation model suitable for battery information collected during a predetermined interval. As a result, the battery life estimation apparatus 600 prevents overfitting from occurring when diverse pattern information is learned. For example, the battery life estimation apparatus 600 generates battery degradation models based on characteristics of usage, and compares and selects battery degradation models representing similar pattern information corresponding to real-time battery information collected during a predetermined interval. Accordingly, the battery life estimation apparatus 600 accurately estimates battery life information.

Figure 7:
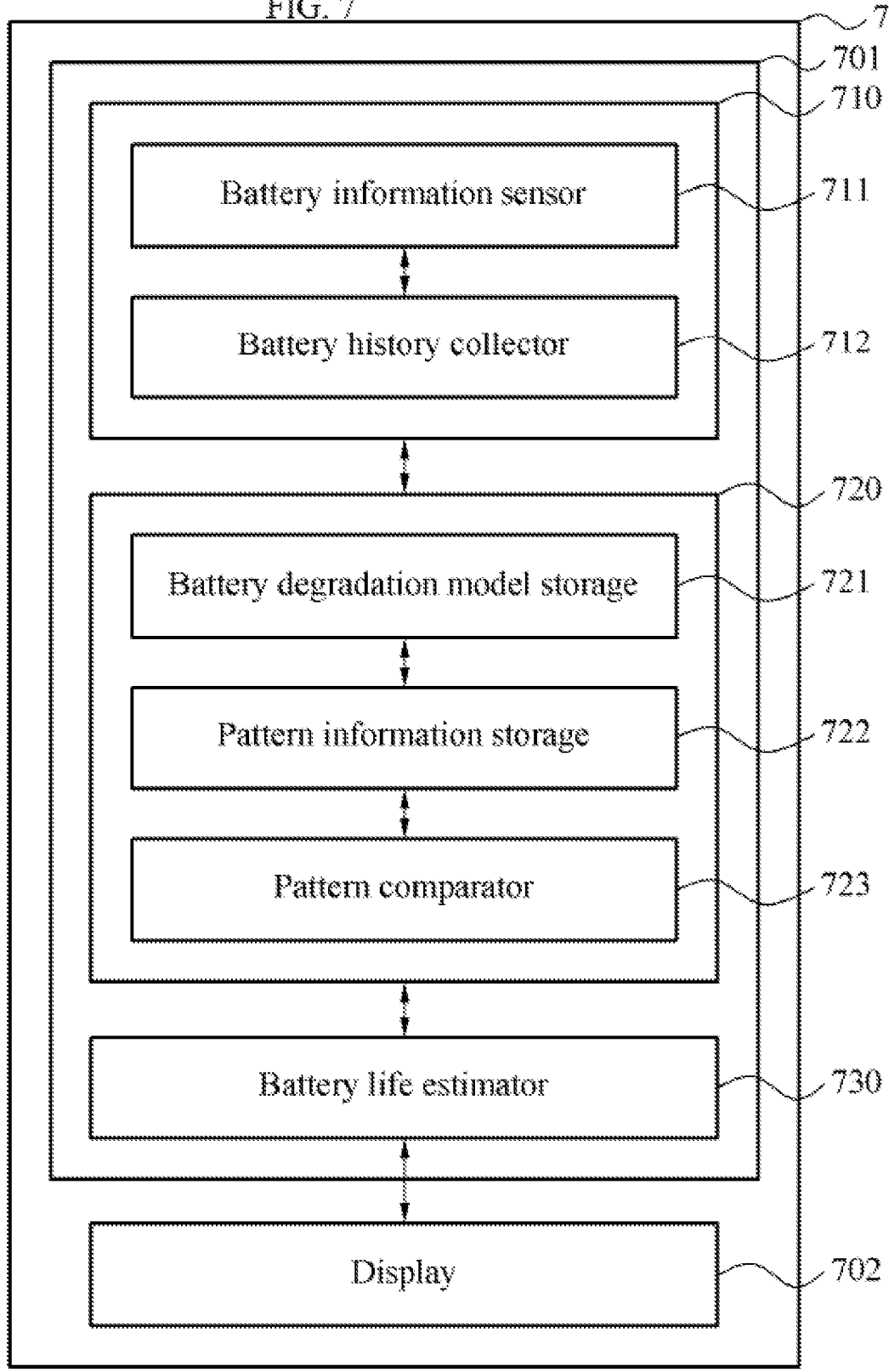
FIG. 7 is a block diagram illustrating an example of a configuration of an apparatus to which an apparatus for estimating a battery life is applied.

FIG. 7 illustrates an example of an apparatus 700 to which a battery life estimation apparatus 701 is applied.

Referring to FIG. 7, the apparatus 700 includes the battery life estimation apparatus 701, and a display 702. The battery life estimation apparatus 701 includes a battery information collector 710, a model determiner 720, and a battery life estimator 730. The apparatus 700 includes, for example, all electric apparatuses using batteries, for example, EVs, smartphones, and other electrical apparatuses.

The battery information collector 710 includes a battery information sensor 711 and a battery history collector 712.

The battery information sensor 711 senses battery information in real time. The battery information includes, for example, a voltage and a current sensed from a battery, a surface temperature of the battery, an ambient temperature of the battery, and other parameters associated with the battery. For example, the battery information sensor 711 senses battery information in a digital form, or senses battery information in a predetermined unit (for example, 1 second, a second longer than 1 second, or shorter than 1 second).

The battery history collector 712 stores a history indicating that the battery is continuously used. For example, the battery history collector 712 divides and stores the battery information in a unit of a predetermined interval. The battery history collector 712 temporarily or semipermanently stores the battery information. For example, when estimating of battery life information from battery information collected during a predetermined interval is completed, the battery history collector 712 deletes or maintains the battery information.

The model determiner 720 includes a battery degradation model storage 721, a pattern information storage 722, and a pattern comparator 723.

The battery degradation model storage 721 stores battery degradation models corresponding to diverse characteristics of usage. In an example, when a battery is mounted in an EV, the characteristic of usage includes a high-speed mode characteristic, a medium-speed mode characteristic, a low-speed mode characteristic, a ultra low-speed mode characteristic, a city driving characteristic, a highway driving characteristic, a suburban driving characteristic, a low acceleration characteristic, and other characteristics of usage. In another example, when a battery is mounted in a smartphone, the characteristic of usage includes a web browsing characteristic, a game characteristic, a moving image characteristic, a phone call characteristic, and other characteristics of usage.

Additionally, the battery degradation model storage 721 receives, in an offline state, a battery degradation model. The battery degradation model learning apparatus 800 learns pattern information corresponding to a characteristic of usage from a battery degradation model of FIG. 8, and stores the received battery degradation model. For example, during manufacturing of the apparatus 700 with a battery, information associated with a battery degradation model that the battery degradation model learning apparatus 800 learned is input to the battery degradation model storage 721.

Each of the battery degradation models includes a type of a learner applied to each of the battery degradation models, and information associated with a parameter of the learner. The type and the parameter of the leaner is determined based on the characteristic of usage, and will be further described with reference to FIG. 8.

The pattern information storage 722 stores pattern information corresponding to each of the battery degradation models. The pattern information is obtained by partitioning reference information corresponding to each of the battery degradation models for each predetermined interval.

The pattern comparator 723 compares the collected battery information to pattern information of each of at least one battery degradation model, and selects a battery degradation model representing pattern information most similar to the collected battery information from among the at least one battery degradation model.

For example, the pattern comparator 723 computes a similarity between the collected battery information and each of the battery degradation models, and selects a battery degradation model corresponding to a highest similarity. The similarity refers to a degree to which the pattern information and the battery information are similar to each other, and is computed as a score or a ratio. For example, when a similarity is represented as a ratio or percentage, and when the pattern information and the battery information are completely identical to each other, a similarity between the pattern information and the battery information may be 100%. An example of computing a similarity will be further described with reference to FIG. 16.

The battery life estimator 730 estimates battery life information from battery information, based on a battery degradation model selected by the model determiner 720. For example, the model determiner 720 selects a single battery degradation model or a plurality of battery degradation models. When the model determiner 720 selects a plurality of battery degradation models, the battery life estimator 730 estimates battery life information, based on a composite model generated by combining the battery degradation models.

The display 702 displays the battery life information estimated by the battery life estimator 730.

Figure 8:
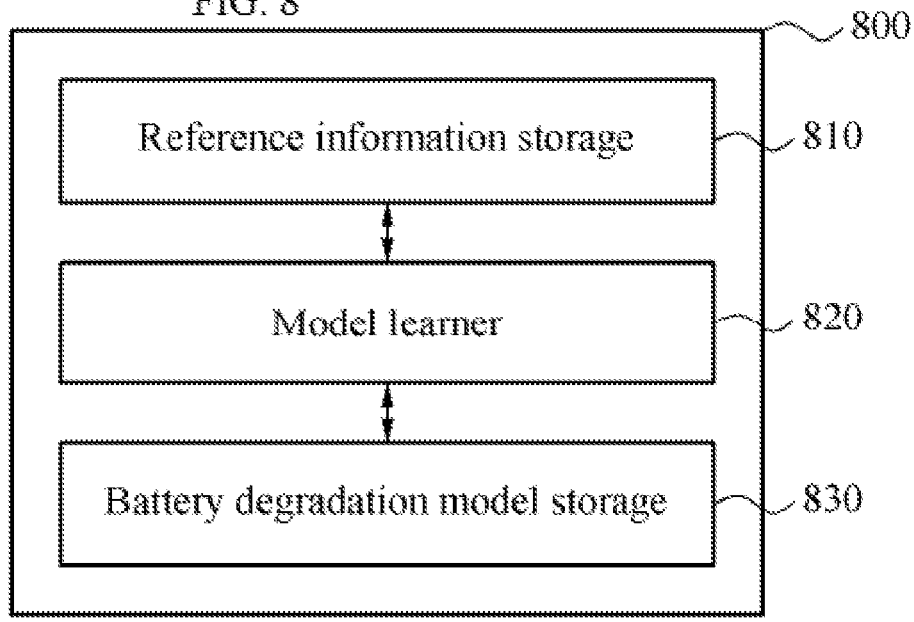
FIG. 8 is a block diagram illustrating an example of a configuration of an apparatus for learning a battery degradation model.

FIG. 8 illustrates an example of a configuration of the battery degradation model learning apparatus 800.

Referring to FIG. 8, the battery degradation model learning apparatus 800 includes a reference information storage 810, a model learner 820, and a battery degradation model storage 830.

The reference information storage 810 stores reference information used to learn a battery degradation model. For example, the reference information storage 810 stores reference information that is collected in advance and that corresponds to at least one predefined characteristic of usage.

The model learner 820 learns a battery degradation model corresponding to each characteristic of usage, based on the reference information and pattern information into which the reference information is partitioned. The model learner 820 includes a learner configured to learn a battery degradation model.

The model learner 820 includes a mathematical function. When an input and output of the mathematical function are given, the model learner 820 learns a parameter of the mathematical function to generate an output corresponding to the input. The parameter of the mathematical model is, for example, a parameter of a battery degradation model, and includes the characteristic of usage corresponding to the battery degradation model. For example, the battery life estimator 730 of FIG. 7 outputs battery life information, based on a mathematical function according to the type of the model learner 820 and the parameter, in response to an input of battery information.

The model learner 820 includes, for example, one of a neural network, a hidden Markov model (HMM), a Beyesian network, a support vector machine (SVM), and a decision tree (DT).

The battery degradation model storage 830 stores the battery degradation model learned by the model learner 820. The battery degradation model stored in advance in the battery degradation model storage 830 is transferred to the battery life estimation apparatus 701 of FIG. 7.

FIGS. 9 through 12 illustrate examples of pattern information corresponding to characteristics of usage.

FIGS. 9 through 12 illustrate a current as pattern information, however, there is no limitation thereto. The pattern information includes a current, a voltage, a temperature, a battery life, and other parameters of a battery known to one of ordinary skill in the art. In the examples of FIGS. 9 through 12, a battery is mounted in an EV.

Figure 9:
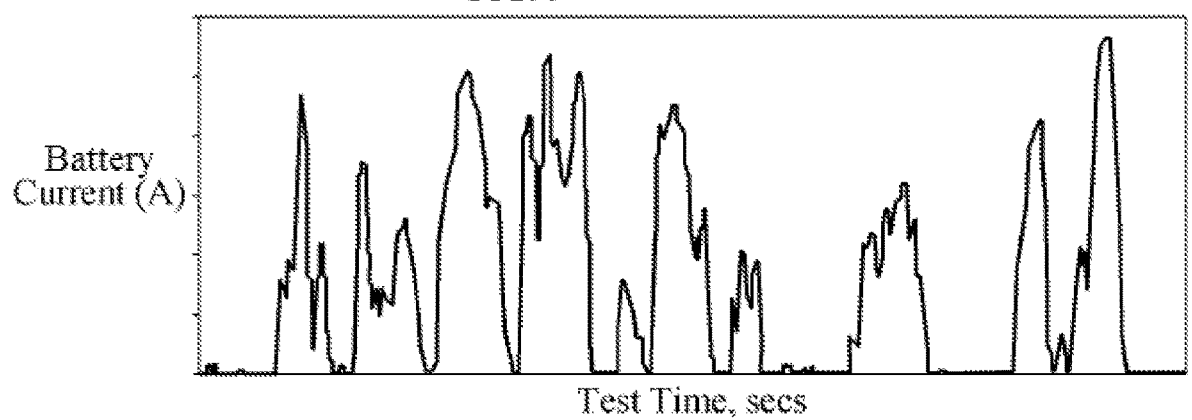
FIGS. 9 through 12 illustrate examples of pattern information corresponding characteristics of usage.

The pattern information of FIG. 9 represents a city driving characteristic in an example in which the EV travels in a city. Referring to FIG. 9, a current has a value of "0" in a large number of intervals, because the EV frequently stops.

Figure 10:
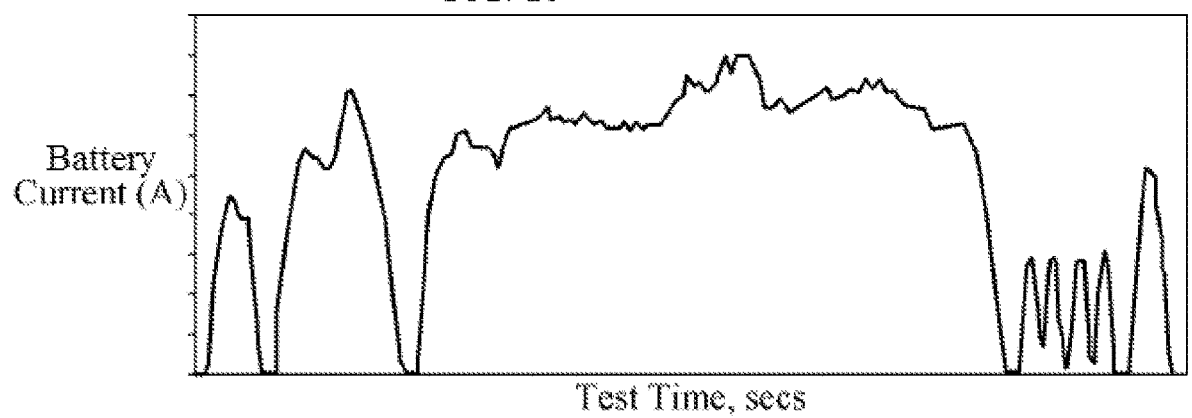

The pattern information of FIG. 10 represents a highway driving characteristic in an example in which the EV travels in a highway. Referring to FIG. 10, a high current is maintained for a relatively long period of time, because the EV travels at a high speed.

Figure 11:
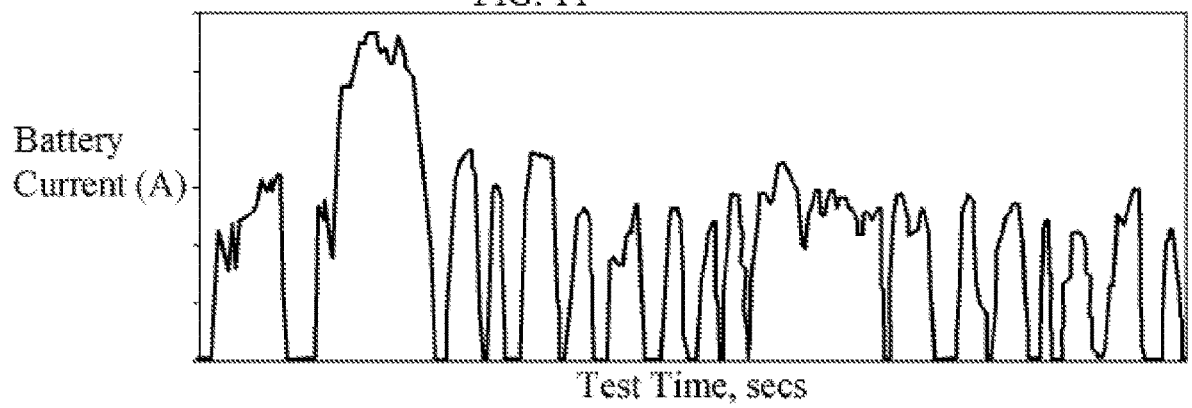

The pattern information of FIG. 11 represents a suburban driving characteristic in an example in which the EV travels through a suburb. Referring to FIG. 11, a current has a value of "0" in a large number of intervals, and values of the current is higher than values of the current of FIG. 9, because the EV frequently accelerates or decelerates.

Figure 12:
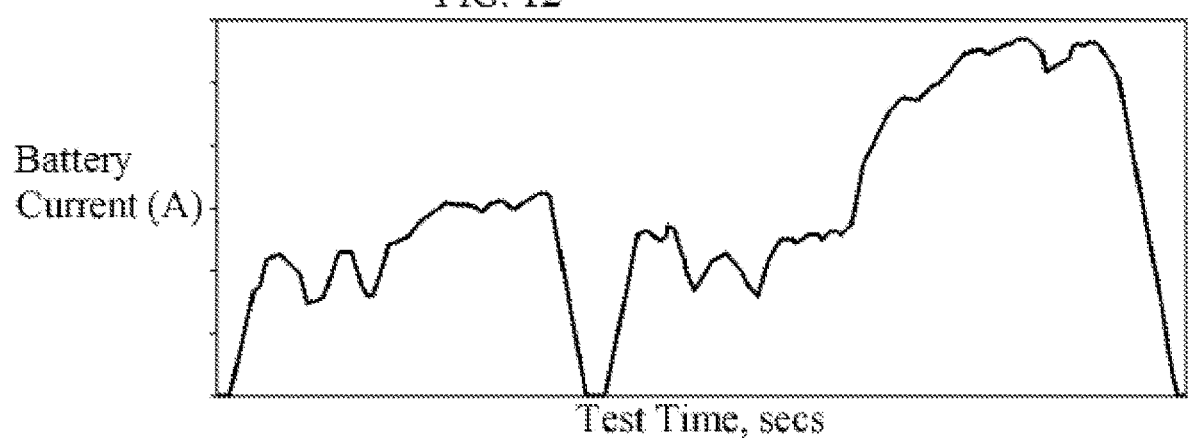

The pattern information of FIG. 12 represents a low acceleration characteristic in an example in which the EV travels at a low acceleration. Referring to FIG. 12, a current has a value of "0" in a few intervals, because the EV travels at the low acceleration.

FIGS. 9 through 12 illustrate examples of the pattern information, however, there is no limitation thereto. Accordingly, a battery life estimation apparatus may use a battery degradation model learned based on pattern information corresponding to diverse characteristics of usage.

Figure 13:
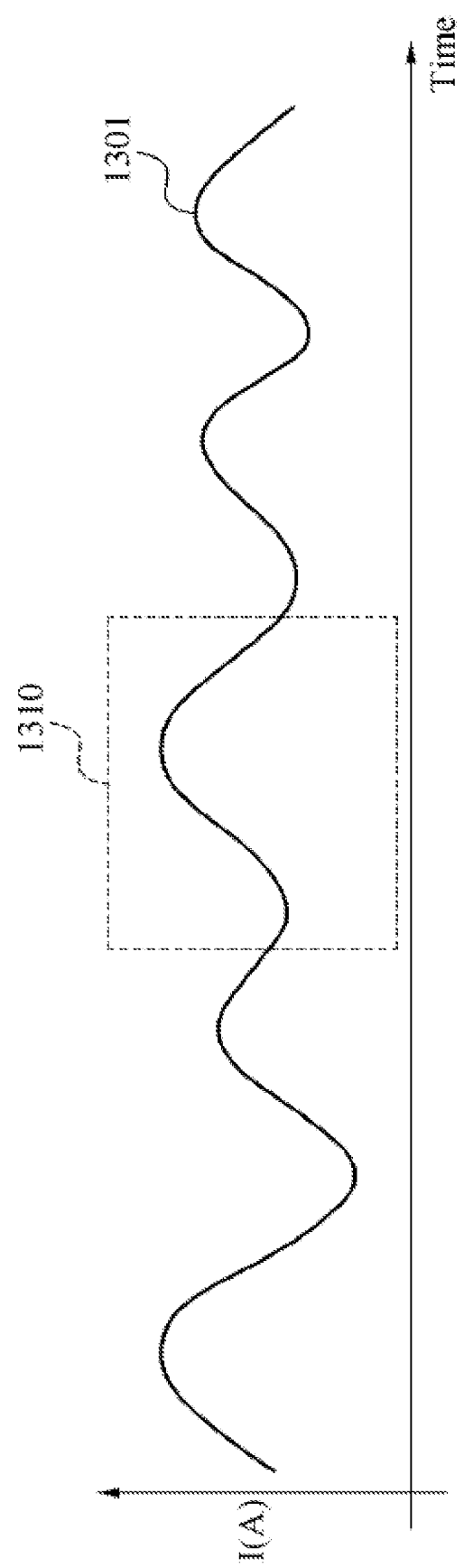
FIG. 13 illustrates an example of battery information.

FIG. 13 illustrates an example of battery information.

FIG. 13 illustrates a current as battery information, however, there is no limitation thereto. For example, the battery information includes a current, a voltage, a temperature, a battery life, and other parameters associated with a battery.

Referring to FIG. 13, a battery life estimation apparatus senses battery information 1301 in real time, and compares pattern information to battery information 1310 corresponding to a predetermined interval among the sensed battery information 1301.

Figure 14:
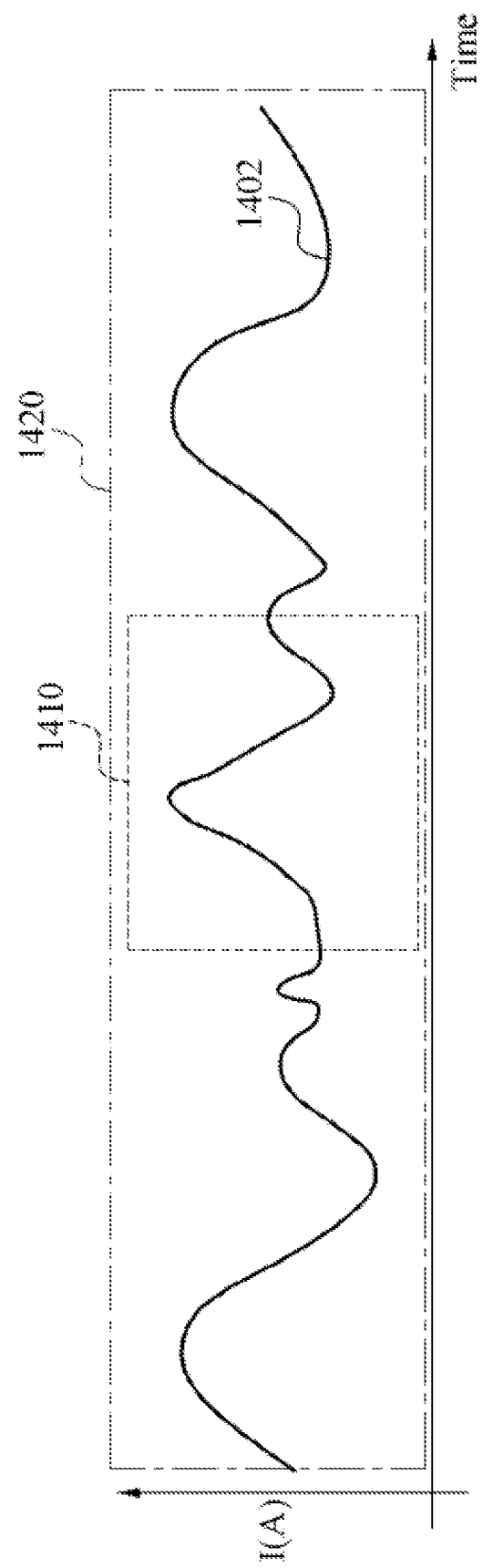
FIG. 14 illustrates an example of reference information.

FIG. 14 illustrates an example of reference information.

FIG. 14 merely illustrates a current as reference information including pattern information, however, there is no limitation thereto. For example, each of the reference information and the pattern information includes a current, a voltage, a temperature, and other parameters associated with a battery.

Referring to FIG. 14, reference information 1420 includes battery information 1402 stored in advance based on a characteristic of usage. Additionally, the reference information 1420 is partitioned into pattern information 1410 for each predetermined interval, and is stored as the pattern information 1410.

Figure 15:
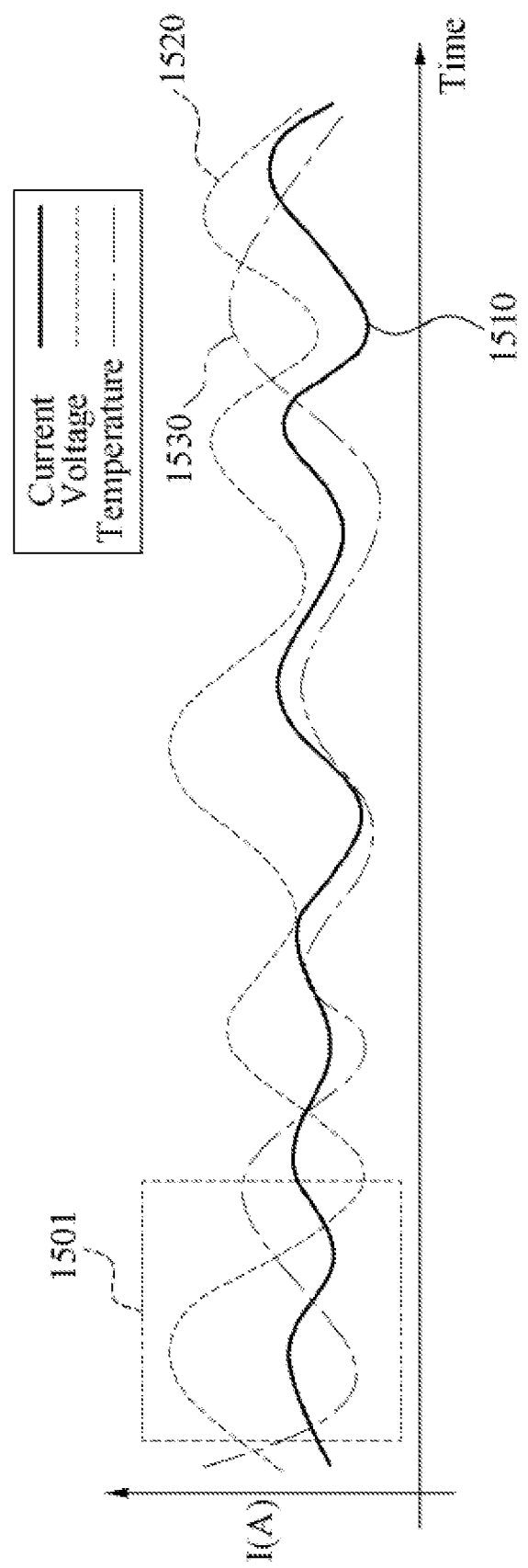
FIG. 15 illustrates another example of battery information.

FIG. 15 illustrates another example of battery information.

For example, a battery life estimation apparatus senses a current 1510, a voltage 1520 and a temperature 1530 of a battery as battery information in real time. The battery life estimation apparatus stores battery information 1501 corresponding to a predetermined interval to compare the battery information 1501 to pattern information.

FIG. 15 illustrates a single predetermined interval, however, there is no limitation thereto. Intervals are determined in advance for each pattern information of each time slot based on a time axis.

Figure 16:
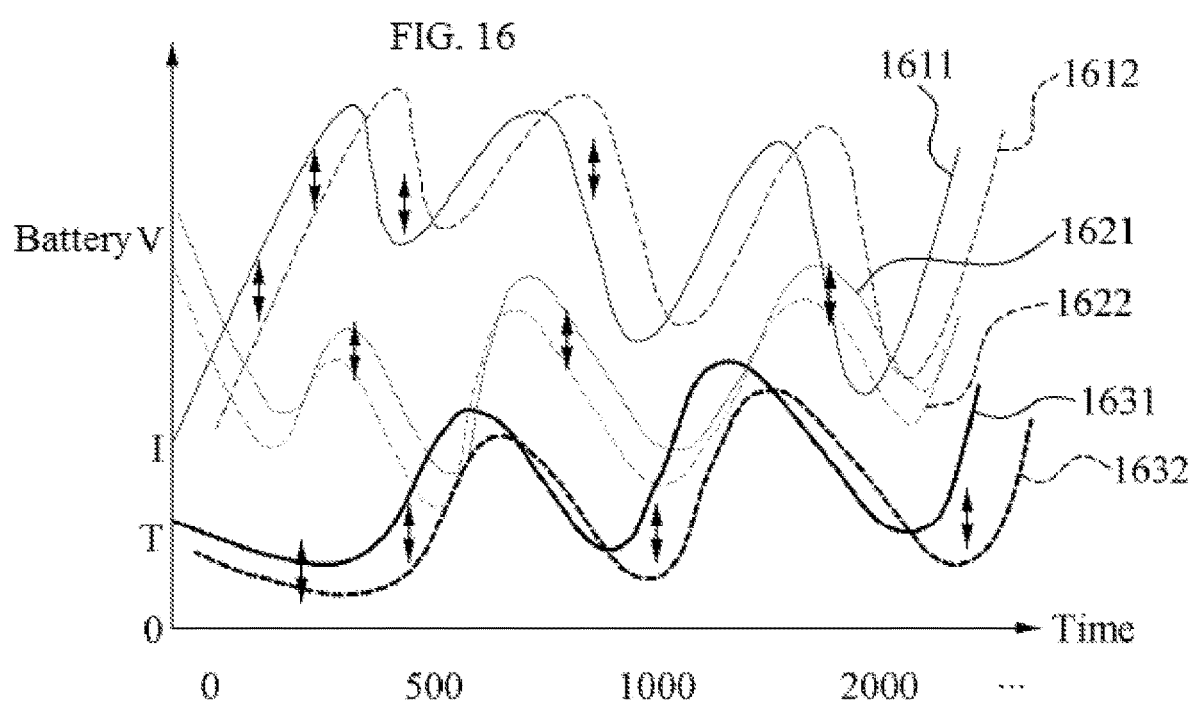
FIG. 16 illustrates an example of a comparison between battery information and pattern information.

FIG. 16 illustrates an example of a comparison between battery information and pattern information.

Figure 19:
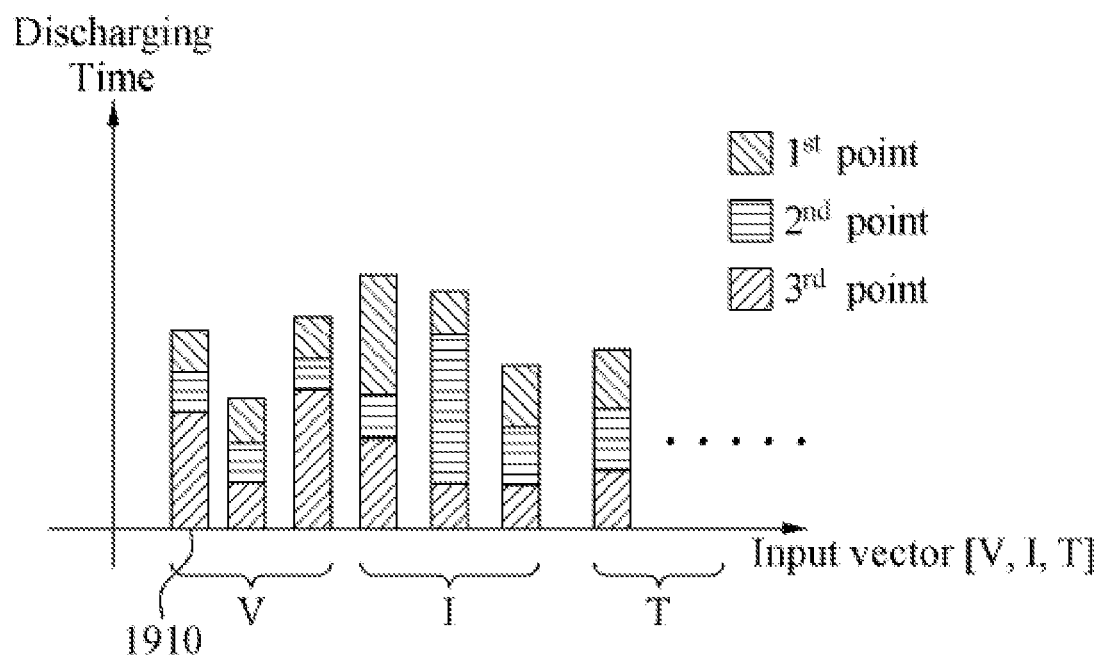

A battery life estimation apparatus computes a similarity between collected battery information and pattern information corresponding to a battery degradation model, based on a distance comparison, a histogram comparison, and a distribution comparison between the battery information and the pattern information. The distance refers to a difference between a value of battery information and a value of pattern information at a predetermined point in time. The histogram represents battery information and pattern information accumulated in each section, for example, as shown in FIG. 19. The distribution includes, for example, a distribution of battery information and pattern information for each time slot, or for each section.

FIG. 16 illustrates a result obtained by comparing distances between the battery information and the pattern information. For example, the battery life estimation apparatus compares distances between a current 1611, a voltage 1621 and a temperature 1631 of battery information collected during a predetermined interval and a current 1612, a voltage 1622 and a temperature 1632 of pattern information. In this example, each of the distances refers to a difference between values of signals at a predetermined point in time. The battery life estimation apparatus determines pattern information with a lowest sum of the distances to be most similar to the battery information.

Figure 17:
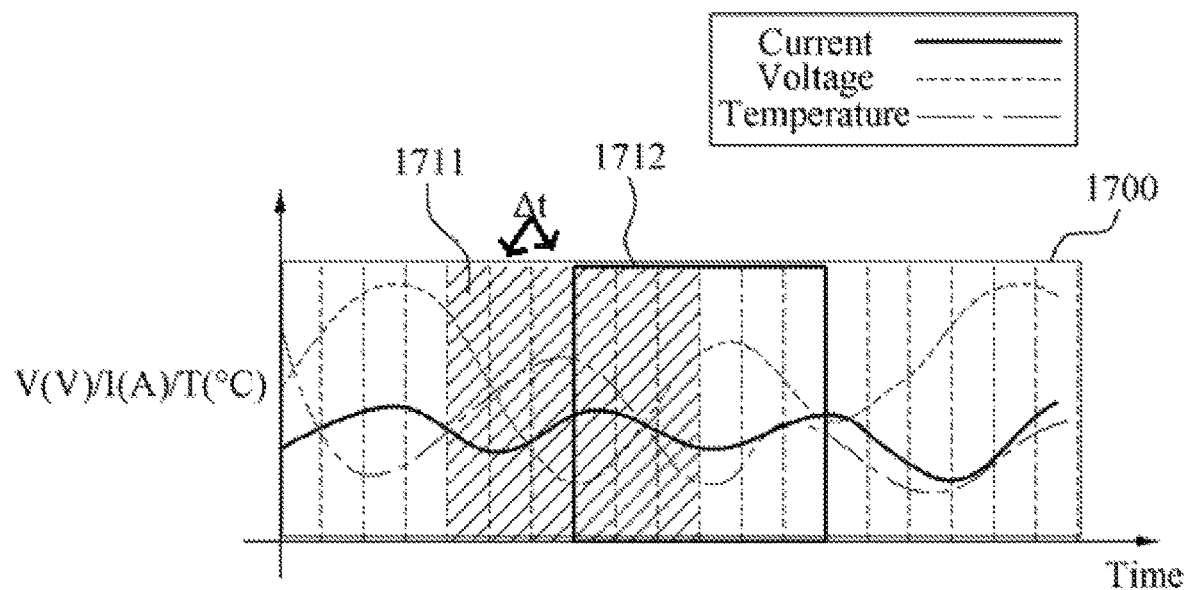
FIG. 17 illustrates an example of pattern information corresponding to time division of reference information.

FIG. 17 illustrates an example of pattern information corresponding to time division of reference information.

Referring to FIG. 17, time division is performed on reference information 1700 for each predetermined interval, and the reference information 1700 is partitioned into first pattern information 1711 and second pattern information 1712 that respectively correspond to two predetermined intervals. An interval between the first pattern information 1711 and the second pattern information 1712 is defined as a gap Δt. The two predetermined intervals corresponding to the first pattern information 1711 and the second pattern information 1712 are an example in FIG. 17, however, there is no limitation thereto. For example, time intervals of the reference information may be set for each gap Δt.

Figure 18:
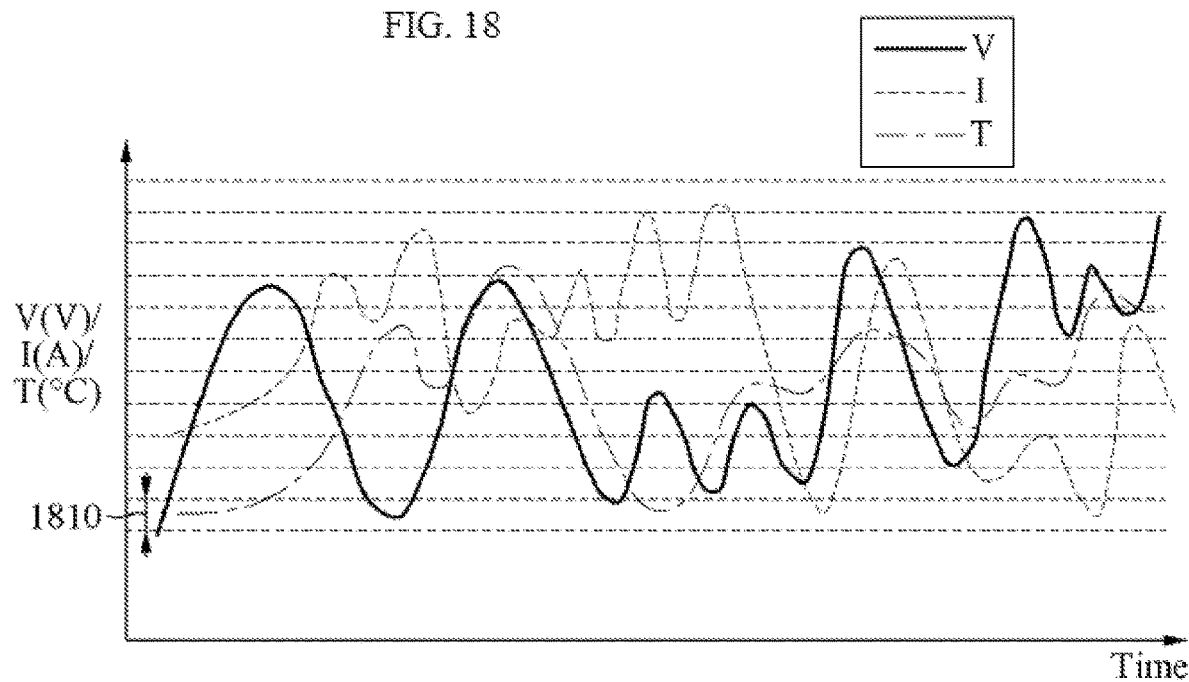
FIGS. 18 and 19 illustrate examples of pattern information corresponding to sections into which reference information is partitioned.

FIGS. 18 and 19 illustrate examples of pattern information corresponding to sections into which reference information is partitioned.

The pattern information corresponds to sections into which the reference information is partitioned with respect to a total time interval. However, there is no limitation thereto, and the pattern information includes information on sections into which the reference information 1700 corresponding to a predetermined interval of FIG. 17 is partitioned. For example, the pattern information includes section information associated with all or a portion of time intervals of the reference information. The section information associated with a portion of the time intervals are, for example, pattern information. The section information will be further described later.

FIG. 18 illustrates an example of pattern information. FIG. 19 illustrates an example of cumulative information obtained by accumulating section information corresponding to pattern information.

For example, a battery life estimation apparatus accumulates amounts of time in which a battery is used for each section corresponding to a predetermined range of each of a voltage, a current, and a temperature. The predetermined range is represented by horizontal dashed lines in FIG. 18. The accumulated amounts of time include, for example, each of elements of an input vector in FIG. 19. In this example, battery life information corresponding to section information accumulated for each section is used as pattern information for a learner and, accordingly, a battery degradation model may be acquired. The battery life information is, for example, an SOH of the battery.

In FIG. 18, a voltage, a current and a temperature of a battery as collected battery information are illustrated based on a time axis. The voltage, the current, and the temperature are partitioned into section information based on predetermined ranges of FIG. 18, and the section information is accumulated as illustrated in FIG. 19. The accumulated section information is represented as an input vector. All horizontal dashed lines of FIG. 18 represent predetermined ranges used to partition battery information.

The input vector refers to a set of data corresponding to the accumulated section information of the battery information. The section information, into which the battery information is partitioned in a predetermined range, illustrates battery information corresponding to a predetermined section. Additionally, the section information includes information on a period of time in which the battery operates in a predetermined section.

For example, every time a voltage (for example, section information) corresponding to a predetermined section 1810 of FIG. 18 is measured at a $1^{st}$ point, a $2^{nd}$ point, and a $3^{rd}$ point, an amount of time in which the voltage is measured is accumulated as an element 1910 of the input vector of FIG. 19. A point may refer to a point in time, or a time window. The element 1910 corresponds to the predetermined interval 1810. In the present description, "adding amounts of time in which battery information (for example, section information) corresponding to a predetermined section is measured, as an element of an input vector" is indicative of "accumulating section information."

For illustrative purposes, three elements of the input vector of FIG. 19 are set for each of cumulative data on section information corresponding to the voltage, cumulative data on section information corresponding to the current, and cumulative data on section information corresponding to the temperature. Accordingly, data corresponding to each section information may be distinguished from each other based on a number of sections in a predetermined range, and may be accumulated.

Figure 20:
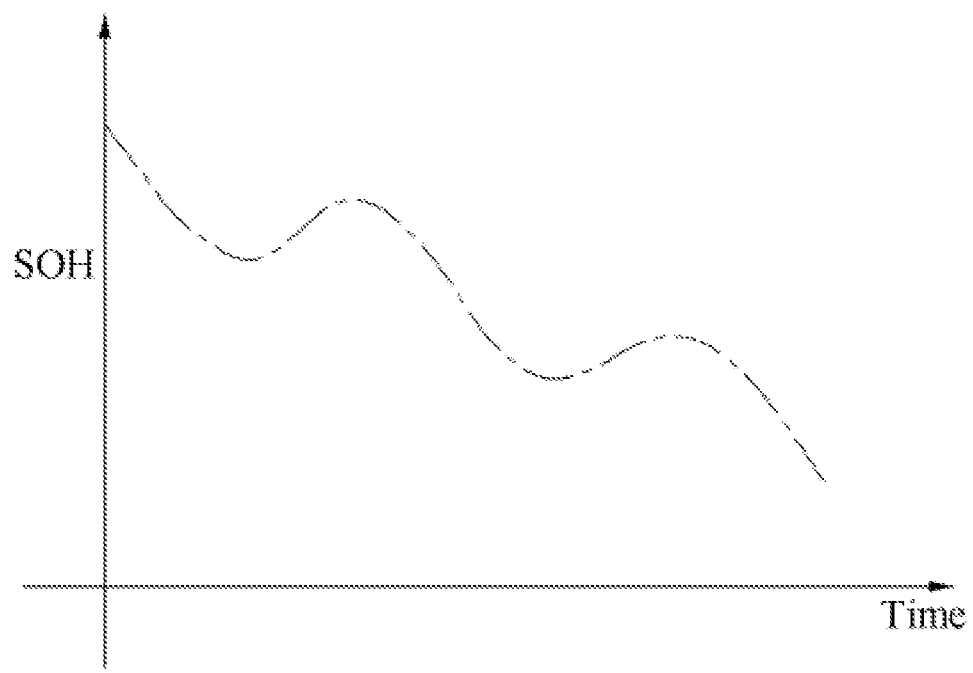
FIG. 20 illustrates an example of battery life information corresponding to a predetermined interval.

FIG. 20 illustrates an example of battery life information corresponding to a predetermined interval.

As described above with reference to FIGS. 15 and 16, when a battery degradation model is selected, a battery life estimation apparatus estimates battery life information. For example, the battery life estimation apparatus estimates a battery life, or a variation in the battery life during a predetermined interval. In FIG. 20, the battery life is represented by an SOH.

FIG. 21 illustrates an example of a method to estimate a battery life.

Referring to FIG. 21, in operation 2110, a battery information collector collects battery information during a predetermined interval. For example, the battery information collector stores battery information sensed for each predetermined interval.

In operation 2120, a model determiner selects a battery degradation model representing pattern information corresponding to the battery information. For example, the model determiner compares the battery information to pattern information, and selects a battery degradation model including pattern information that is most similar to the battery information.

In this example, the model determiner determines whether the battery information and the pattern information are similar to each other in a form, a histogram distribution, a form of a distribution, or an area of a histogram. For example, statistics of a distribution of a data size for an arbitrary time interval are used to compare the battery information and the pattern information. The data size may be, for example, a voltage value, a current value, a temperature value, and other values of a battery known to one of ordinary skill in the art.

For example, the model determiner computes a similarity between the battery information and the pattern information. In this example, the model determiner selects a battery degradation model including pattern information with a similarity exceeding a predetermined threshold. When a plurality of pieces of pattern information each have a similarity exceeding a predetermined threshold, a plurality of battery degradation models are selected, and a weight is applied based on the similarity.

In operation 2130, a battery life estimator estimates battery life information based on the battery degradation model. For example, the battery life estimator estimates a battery life, or a variation in the battery life.

FIG. 22 further illustrates the method of FIG. 21.

Operations 2110, 2120, and 2130 of FIG. 21 are further described with reference to FIG. 22.

Referring to FIG. 22, in operation 2211, a battery information sensor senses battery information in real time. The battery information includes, for example, a current, a voltage, a temperature, and other parameters of a battery known to one of ordinary skill in the art.

In operation 2212, a battery history collector determines whether battery information is collected during a predetermined interval. For example, the battery history collector stores battery information corresponding to the predetermined interval.

In operation 2221, a pattern comparator compares the battery information to pattern information. For example, the pattern comparator computes a similarity between the battery information and the pattern information.

In operation 2222, the pattern comparator selects a battery degradation model. For example, the pattern comparator selects a battery degradation model including pattern information that is most similar to the battery information. Additionally, the pattern comparator selects a battery degradation model including pattern information with a similarity exceeding a predetermined threshold.

In operation 2231, a battery life estimator estimates a capacity change value based on the selected battery degradation model. The capacity change value refers to a value of a capacity changed during a predetermined interval, and corresponds to a variation in a battery life.

In operation 2232, the battery life estimator estimates an SOH. For example, the battery life estimator subtracts the capacity change value from an initial capacity value corresponding to a beginning of a predetermined interval, calculates a ratio of a current capacity value to the initial capacity value, and estimates the SOH.

The description of FIGS. 1 through 20 is also applicable to operations 2110 to 2130 of FIG. 21 and operations 2211 to 2232 of FIG. 22 and; accordingly, will not be repeated. Additionally, the method of FIG. 22 is merely an example and accordingly, an operation of a battery life estimation apparatus is not limited to the method of FIG. 22.

According to various examples, a battery life estimation apparatus is applicable to an apparatus for measuring an SOH of a rechargeable battery, an electronic apparatus and a transportation equipped with a battery, and the like. For example, the battery life estimation apparatus may be applied to a lightweight BMS.

Additionally, the battery life estimation apparatus notifies a user of an apparatus employing a battery of an exact time to replace the battery, by accurately estimating a life of the battery determined based on a scheme to use the battery. Thus, it is possible to alleviate negative feeling about an EV of a user.

Furthermore, the battery life estimation apparatus more accurately estimates a time to replace a battery and; thus, it is possible to prevent, in advance, a problem caused by a battery degradation, and to secure stability of the battery. In addition, due to a high accuracy of estimating a battery life, the time to replace the battery is accurately determined which reduces unnecessary costs to replace the battery.

The units, the collector, the model determiner, the battery life estimator, the pattern comparator, the storages, and the model learner described herein may be implemented using hardware components. For example, the hardware components may include microphones, controllers, processors, memories, sensors, amplifiers, band-pass filters, audio to digital convertors, and processing devices. A processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

It is to be understood that in the embodiment of the present invention, the operations in FIGS. 21 and 22 are performed in the sequence and manner as shown although the order of some operations and the like may be changed without departing from the spirit and scope of the described configurations. In accordance with an illustrative example, a computer program embodied on a non-transitory computer-readable medium may also be provided, encoding instructions to perform at least the method described in FIGS. 21 and 22.

Program instructions to perform a method described in FIGS. 21 and 22, or one or more operations thereof, may be recorded, stored, or fixed in one or more non-transitory computer-readable storage media. The program instructions may be implemented by a computer. For example, the computer may cause a processor to execute the program instructions. The media may include, alone or in combination with the program instructions, data files, data structures, and the like. Examples of computer-readable media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The program instructions, that is, software, may be distributed over network coupled computer systems so that the software is stored and executed in a distributed fashion. For example, the software and data may be stored by one or more computer readable recording mediums. Also, functional programs, codes, and code segments for accomplishing the example embodiments disclosed herein may be easily construed by programmers skilled in the art to which the embodiments pertain based on and using the flow diagrams and block diagrams of the figures and their corresponding descriptions as provided herein.

The non-transitory computer readable recording medium may include any data storage device that can store data which can be thereafter read by a computer system or processing device. Examples of the non-transitory computer readable recording medium include read-only memory (ROM), random-access memory (RAM), CD-ROMs, magnetic tapes, floppy disks, optical data storage devices. Also, functional programs, codes, and code segments that accomplish the examples disclosed herein can be easily construed by programmers skilled in the art to which the examples pertain based on and using the flow diagrams and block diagrams of the figures and their corresponding descriptions as provided herein.

As a non-exhaustive illustration only, a terminal or device described herein may refer to mobile devices such as a cellular phone, a personal digital assistant (PDA), a digital camera, a portable game console, and an MP3 player, a portable/personal multimedia player (PMP), a handheld e-book, a portable laptop PC, a global positioning system (GPS) navigation, a tablet, a sensor, and devices such as a desktop PC, a high definition television (HDTV), an optical disc player, a setup box, a home appliance, and the like that are capable of wireless communication or network communication consistent with that which is disclosed herein.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A processor-implemented method, performed by one or more processors of a computing apparatus in a battery management system, to estimate a battery life, the method comprising:
   sensing, using a sensor, battery information from a battery;
   determining pattern information associated with the sensed battery information of the battery;
   determining a battery degradation model representing pattern information corresponding to the determined pattern information of the sensed battery information and being selected from among battery degradation models,
   wherein the determining of the battery degradation model further comprises:
      determining similarities between the sensed battery information and each of the battery degradation models; and
      determining the battery degradation model with the determined similarities exceeding a predetermined threshold value of at least one of a voltage, a current, a surface temperature, or an ambient temperature of the battery; and
   estimating battery life information of the battery, based on the determined battery degradation model, wherein the battery life information is quantified by a SOH (State Of Health) of the battery.

2. The method of claim 1, wherein each of the battery degradation models is generated by modeling a degradation in the battery due to a characteristic of usage based on pre-stored reference information.

3. The method of claim 2, wherein the characteristic of usage comprises at least one of a city driving characteristic, a highway driving characteristic, a suburban driving characteristic, a low acceleration characteristic, a web browsing characteristic, a game characteristic, a moving image characteristic, and a phone call characteristic.

4. The method of claim 2, wherein the pattern information of the determined battery degradation model is determined by partitioning the reference information for each of predetermined intervals.

5. The method of claim 1, wherein the determining of the similarities further comprises:
   determining the similarities based on at least one of a distance comparison, a histogram comparison, and a distribution comparison between the sensed battery information and respective pattern information corresponding to each of the battery degradation models.

6. The method of claim 1, wherein the determining of the battery degradation model further comprises:
   determining one or more battery degradation models representing pattern information corresponding to the determined pattern information of the sensed battery information; and
   applying a determined corresponding weight to each of the determined one or more battery degradation models based on a respective similarity with the sensed battery information.

7. The method of claim 6, wherein the estimating comprises:
   estimating the battery life information based on a composite model being generated by combining the battery degradation models to which the determined corresponding weight is applied.

8. A non-transitory computer readable recording medium storing a program to cause a computer to implement the method of claim 1.

9. The method of claim 1, wherein the estimating further comprises:
   comparing the determined pattern information of the sensed battery life information to respective pattern information of each of the battery degradation models; and
   determining the battery degradation models representing the pattern information that are determined to be most similar to the determined pattern information of the sensed battery information based on a result of the comparing.

10. A processor-implemented method, performed by one or more processors of a computing apparatus in a battery management system, to estimate a battery life, the method comprising:
- comparing determined pattern information of sensed battery information, being sensed from a battery using a sensor, to respective pattern information of each of the battery degradation models;
- determining a battery degradation model representing pattern information that is determined to be most similar to the determined pattern information of the sensed battery information based on a result of the comparing,
- wherein the determining of the battery degradation model further comprises:
  - determining similarities between the sensed battery information and each of the battery degradation models; and
  - determining the battery degradation model with the determined similarities exceeding a predetermined threshold value of at least one of a voltage, a current, a surface temperature, or an ambient temperature of the battery; and
- estimating battery life information of the battery, based on the determined battery degradation model.

11. An apparatus to estimate a battery life, the apparatus comprising:
- a battery information collector configured to sense, using a sensor, battery information from a battery;
- a model determiner configured to:
  determine pattern information associated with the sensed battery information of the battery;
  determine a battery degradation model representing pattern information corresponding to the determined pattern information of the sensed battery information and being selected from among battery degradation models,
  wherein for the determining of the battery degradation model, the model determiner is further configured to:
    determine similarities between the sensed battery information and each of the battery degradation models; and
    determine the battery degradation model with the determined similarities exceeding a predetermined threshold value of at least one of a voltage, a current, a surface temperature, or an ambient temperature of the battery; and
- a battery life estimator configured to estimate battery life information of the battery, based on the determined battery degradation model, wherein the battery life information is quantified by a SOH (State Of Health) of the battery.

12. The apparatus of claim 11, wherein each of the battery degradation models is generated by modeling a degradation in the battery due to a characteristic of usage based on pre-stored reference information, and wherein the battery life information comprises at least one of a battery life and a variation in the battery life.

13. The apparatus of claim 12, wherein the characteristic of usage comprises at least one of a city driving characteristic, a highway driving characteristic, a suburban driving characteristic, a low acceleration characteristic, a web browsing characteristic, a game characteristic, a moving image characteristic, and a phone call characteristic.

14. The apparatus of claim 12, wherein the pattern information is determined by partitioning the reference information for each of predetermined intervals.

15. The apparatus of claim 11, wherein the model determiner is configured to compare the determined pattern information of the sensed battery information to respective pattern information of each of the battery degradation models, and to determine the battery degradation models representing the pattern information that is determined to be most similar to the determined pattern information of the sensed battery information based on a result of the comparing.

16. The apparatus of claim 11, wherein the model determiner is configured to determine the similarities based on at least one of a distance comparison, a histogram comparison, and a distribution comparison between the sensed battery information and respective pattern information corresponding to each of the battery degradation models.

17. The apparatus of claim 11, wherein the model determiner is configured to determine one or more battery degradation models representing pattern information corresponding to the determined pattern information of the sensed battery information, and to apply a determined corresponding weight to each of the determined one or more battery degradation models, based on a respective similarity with the sensed battery information.

18. The apparatus of claim 17, wherein the battery life estimator is configured to estimate the battery life information, based on a composite model being generated by combining the battery degradation models to which the determined corresponding weight is applied.

* * * * *